(12) United States Patent
Jiang et al.

(10) Patent No.: US 8,598,881 B2
(45) Date of Patent: Dec. 3, 2013

(54) MAGNETIC RESONANCE IMAGING SYSTEM WITH THERMAL RESERVOIR AND METHOD FOR COOLING

(75) Inventors: Longzhi Jiang, Florence, SC (US); Ernst Wolfgang Stautner, Niskayuna, NY (US); John Scaturro, Jr., Florence, SC (US); William Louis Einziger, Florence, SC (US)

(73) Assignee: General Electric Company, Schenectady, NY (US)

( * ) Notice: Subject to any disclaimer, the term of this patent is extended or adjusted under 35 U.S.C. 154(b) by 341 days.

(21) Appl. No.: 13/004,700

(22) Filed: Jan. 11, 2011

(65) Prior Publication Data
US 2012/0176134 A1    Jul. 12, 2012

(51) Int. Cl.
*G01V 3/00*    (2006.01)
(52) U.S. Cl.
USPC .......................................... 324/319; 324/320
(58) Field of Classification Search
USPC .............................. 324/319, 320, 321; 335/216
See application file for complete search history.

(56) References Cited

U.S. PATENT DOCUMENTS

| | | | |
|---|---|---|---|
| 4,516,405 A * | 5/1985 | Laskaris | 62/50.7 |
| 4,680,936 A | 7/1987 | Sarwinski et al. | |
| 5,304,972 A * | 4/1994 | Sato | 335/216 |
| 5,361,054 A * | 11/1994 | Knuttel | 335/216 |
| 5,568,104 A | 10/1996 | Laskaris et al. | |
| 6,241,966 B1 | 6/2001 | Albert et al. | |
| 6,717,408 B2 | 4/2004 | Minas et al. | |
| 7,432,712 B2 | 10/2008 | Motoshiromizu et al. | |
| 2002/0145426 A1 | 10/2002 | Minas et al. | |
| 2006/0079867 A1 | 4/2006 | Berzak et al. | |
| 2007/0051116 A1 | 3/2007 | Glemot et al. | |
| 2008/0047836 A1 | 2/2008 | Strand et al. | |
| 2010/0210008 A1 | 8/2010 | Strand et al. | |
| 2010/0231215 A1 | 9/2010 | Ma et al. | |

FOREIGN PATENT DOCUMENTS

GB    2126694 A    3/1984
GB    2424469 A    9/2006

OTHER PUBLICATIONS

Search Report from corresponding GB Application No. GB1200353.9 dated May 11, 2012.

* cited by examiner

*Primary Examiner* — Louis Arana
(74) *Attorney, Agent, or Firm* — The Small Patent Law Group; Dean D. Small

(57) ABSTRACT

A magnetic resonance imaging (MRI) system with a thermal reservoir and method for cooling are provided. A cooling vessel for a magnet system of the MRI system includes a first portion containing a helium cryogen in contact with a plurality of magnet coils of an MRI system. The cooling vessel also includes a second portion separate from and fluidly decoupled from the first portion, with the second portion containing a material different than the helium cryogen and having a volume greater than the first portion.

20 Claims, 6 Drawing Sheets

MAGNETIC RESONANCE IMAGING SYSTEM WITH THERMAL RESERVOIR AND METHOD FOR COOLING

BACKGROUND OF THE INVENTION

The subject matter disclosed herein relates generally to cryogenically cooled magnetic resonance imaging (MRI) systems, and more particularly to systems and methods for cooling the magnet coils of the MRI systems.

In superconducting coil MRI systems, the coils forming the superconducting magnets are typically cryogenically cooled using a helium vessel. In these conventional MRI systems, the superconducting coils are cooled in a bath of liquid Helium (He), such that the coils are immersed in the liquid He. This cooling arrangement requires the use of an extremely large high pressure vessel that contains a significant amount of liquid He (e.g., 1500-2000 liters of liquid He). The resulting structure is not only expensive to manufacture, but heavy.

Additionally, in some instances the helium vessel may not be completely filled, such as to save cost. In this situation, portions of the wires forming the coils of the MRI superconducting magnet will be exposed to gas instead of the cooling liquid He. Accordingly, the likelihood of instability and a possible quench event increases. During quench events, the liquid He in these systems can boil-off, wherein the boiled-off helium escapes from the cryogen bath in which the magnet coils are immersed. Each quench, followed by a re-fill and re-ramp of the magnet, is an expensive and time consuming event.

Thus, a significant amount of liquid He is needed in conventional MRI systems. This large amount of He is needed not only to fill the large helium vessel, but increases with any subsequent re-fills.

BRIEF DESCRIPTION OF THE INVENTION

In accordance with an embodiment, a cooling vessel for a magnetic resonance imaging (MRI) magnet system is provided. The cooling vessel includes a first portion containing a helium cryogen in contact with a plurality of magnet coils of an MRI system. The cooling vessel also includes a second portion separate from and fluidly decoupled from the first portion, with the second portion containing a material different than the helium cryogen and having a volume greater than the first portion.

In accordance with another embodiment, a magnetic resonance imaging (MRI) magnet system is provided that includes a main magnet former supporting main magnet coils and a secondary former supporting bucking coils. The MRI magnet system also includes a divided cooling vessel having physically separate portions each containing a different cryogen, and wherein the main magnet coils and the bucking coils are covered by the cryogen in one of the separate portions.

In accordance with yet another embodiment, a method for forming a cooling vessel for a magnetic resonance imaging (MRI) system is provided. The method includes aligning a main magnet former and a secondary former in a concentric arrangement, wherein the formers each have magnet coils. The method also includes inserting a divided cooling assembly concentrically between the main magnet former and the secondary former. The divided cooling assembly includes two separate portions for receiving therein a helium cryogen and another different cryogen, wherein the portion for receiving the helium cryogen is smaller than the portion for receiving the different cryogen. The method further includes coupling vessel flanges to each end of the concentrically aligned formers and divided cooling assembly.

DETAILED DESCRIPTION OF THE INVENTION

Figure 1:
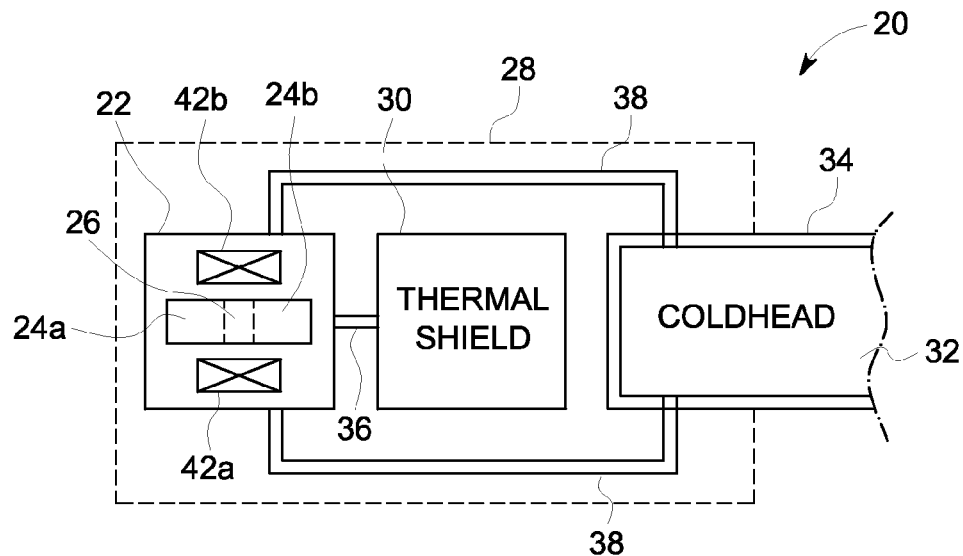
FIG. 1 is a simplified block diagram of magnetic resonance imaging (MRI) magnet system illustrating a divided cooling vessel formed in accordance with various embodiments embodiment.

The foregoing summary, as well as the following detailed description of certain embodiments, will be better understood when read in conjunction with the appended drawings. To the extent that the figures illustrate diagrams of the functional blocks of various embodiments, the functional blocks are not necessarily indicative of the division between hardware. Thus, for example, one or more of the functional blocks may be implemented in a single piece of hardware or multiple pieces of hardware. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments provide systems and methods for cooling a magnetic resonance imaging (MRI) system, in particular, the coils of the superconducting magnet of the MRI system. By practicing at least one embodiment, the volume of liquid Helium (He) used to cool the magnet is reduced, for example, from 1500-2000 liters to about 200 liters, while maintaining complete immersion of the coils of the superconducting magnet (i.e., the wires of the superconducting magnet coils are covered by the liquid He).

Figure 2:
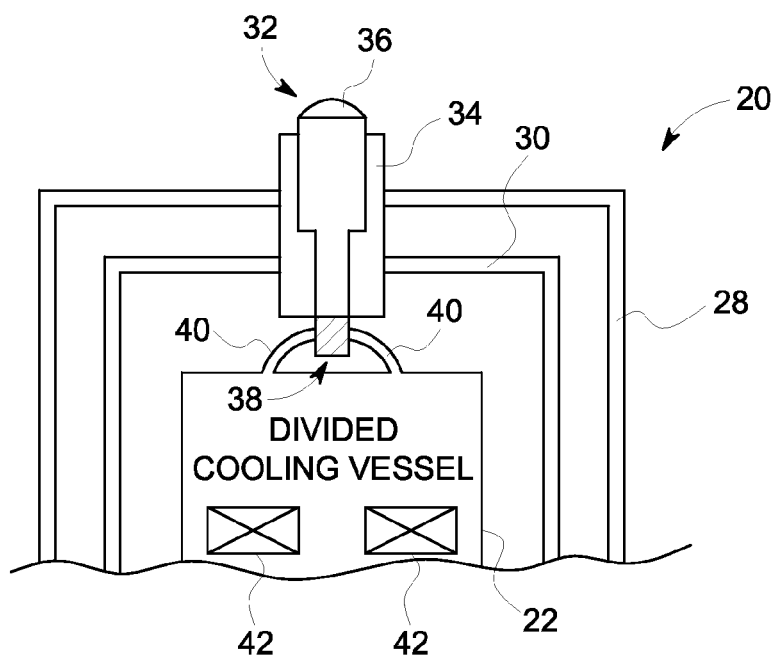
FIG. 2 is a diagram illustrating a divided cooling vessel arrangement formed in accordance with various embodiments.

FIGS. 1 and 2 illustrate embodiments of a cooling arrangement for an MRI system, in particular, for cooling magnets of the MRI system using multiple cryogens provided in separate portions of the helium vessel. For example, in various embodiments, a divided cooling vessel is provided wherein each separate portion includes therein a different cryogen or material. In some embodiments, a reduced volume of liquid He (e.g., liquid He-4, also referred to as He I) is used with the remaining space within the cooling vessel filled with another cryogen, for example, a less expensive liquid Nitrogen ($LN_2$).

Specifically, FIGS. 1 and 2 are simplified block diagrams illustrating an MRI magnet system 20, which includes one or more superconducting magnets. It should be noted that like numerals represent like parts throughout the Figures. The MRI magnet system 20 includes a vessel 22, which is a divided vessel that holds two different liquid cryogens, such as liquid He and $LN_2$. Thus, in this embodiment, the vessel 22 is a cooling or cryogen vessel that includes one or more portions 24a and 24b that contain one type of cryogen and a portion 26 (or multiple portions) that contains another material, such as another type of cryogen. It should be noted that portions 24a and 24b may be physically separate portions or may be joined together or form part of the same portion, for example, a single reservoir, which in various embodiments is a thermal reservoir. In some embodiments, the portions 24a and 24b are larger than the portion 26. In one embodiment, the portions 24a and 24b include $LN_2$ and the portion 26 contains liquid He. The portions 24a and 24b generally define a reservoir in the space that is not part of the portion 26. For example, the portions 24a and 24b in various embodiments are physically separate from the portion 26a. Thus, the portions 24 and 26 define separate first and second cryogen regions containing different cryogens.

It should be noted that the portions 24a, 24b and 26 may be any type of chamber, region, tank or similar structure that define areas having cryogen therein. The portions 24a, 24b and 26 may be separations within or form parts of the vessel 22, which may be a cryogen pressure vessel.

The vessel 22 is surrounded by a vacuum vessel 28 and optionally includes a thermal shield 30 therein and/or therebetween. The thermal shield 30 may be, for example, a thermally isolating radiation shield. A coldhead 32, which in various embodiments is a cryocooler, extends through the vacuum vessel 28 within a coldhead sleeve 34 (e.g., a housing). Thus, the cold end of the coldhead 32 may be positioned within the coldhead sleeve 34 without affecting the vacuum within the vacuum vessel 28. The coldhead 32 is inserted (or received) and secured within the coldhead sleeve 34 using any suitable means, such as one or more flanges and bolts, or other means known in the art. Moreover, a motor 36 of the coldhead 32 is provided outside the vacuum vessel 28.

As illustrated in FIG. 2, the coldhead 32 in various embodiments includes a recondenser 38 at a lower end of the coldhead sleeve 34. The recondenser 38 recondenses boiled off helium gas from the vessel 22. The recondenser 38 is also coupled to the vessel 22 via one or more passageways 40. For example, the passageways 40 may be provided from the vessel 22 to the recondenser 38 for transferring boiled off helium gas from the vessel 22 to the recondenser 38, which then may transfer back recondensed helium liquid to the vessel 22 at the open end. A passageway (not shown) also may be provided from the portion 26 (shown in FIG. 1) to cooling tubes (not shown) in thermal contact with the portion 24.

A magnet 42, which in various embodiments is a superconducting magnet, is provided inside the vessel 22 and is controlled during operation of the MRI system as described in more detail herein to acquire MRI image data. Additionally, during operation of the MRI system, liquid cryogen within the vessel 22 of the MRI magnet system 20 cools the superconducting magnet 42, which may be configured as a coil assembly as is known, for example, including different coils, such as main magnet coils 42a and bucking/shield coils 42b (shown in FIG. 1). The superconducting magnet 42 may be cooled, for example, to a superconducting temperature, such as 4.2 Kelvin (K). The cooling process may include the recondensing of boiled off He gas to liquid by the recondenser 38 and returned to the vessel 22, as well as cooling of the boiled off He by the thermal reservoir formed from portion(s) 24, such as by passing through one or more gas passageways (not shown) that connect the portion 26 to cooling tubes in thermal contact with the portion 24. The thermal reservoir also allows for cooling of the magnet 42 during transportation.

Figure 3:
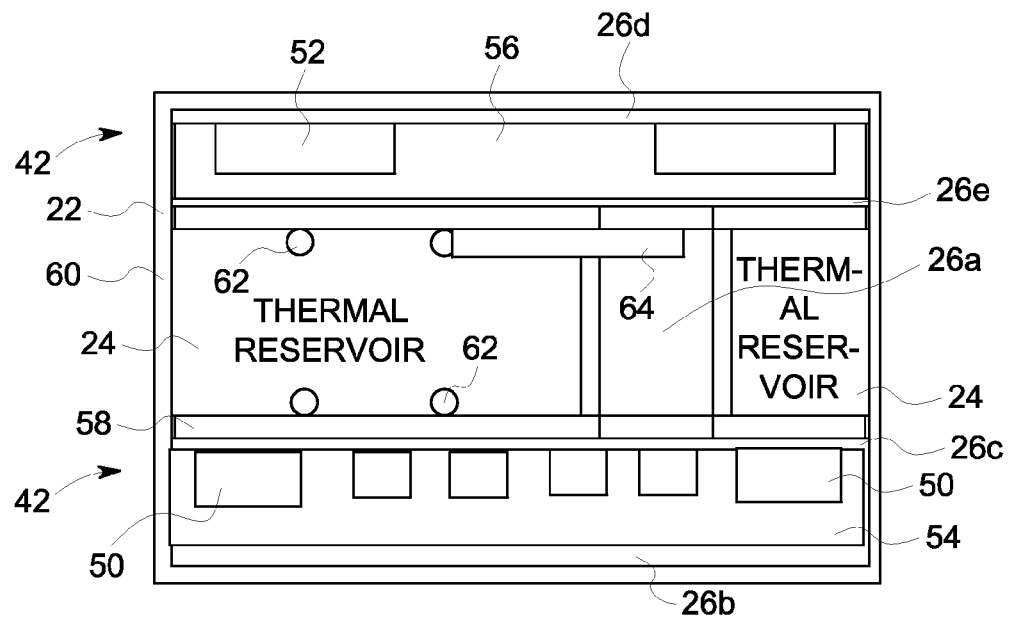
FIG. 3 is a schematic block diagram of a divided cooling vessel formed in accordance with one embodiment.

One embodiment of the vessel 22 is illustrated in FIG. 3, which is a simplified block diagram of the vessel 22. The vessel 22 is a liquid cryogen cooling vessel, which is embodied as a multi-cryogen cooling vessel. The vessel 22 includes the portion 24, which is configured as a self-contained thermal reservoir. The portion 24 is filled (which may be partially or completely filled) with a high heat capacity material, which in one embodiment is $LN_2$. In this embodiment, when the MRI magnet system 20 has been ramped-up and is operating at a superconducting temperature of 4.2K, the Nitrogen ($N_2$) is in a solid state. In the solid state, the $N_2$ has a high heat capacity (boils at about 77K at atmospheric pressure), which may be useful during boil off of the liquid He in the portion 26.

The area or space in the vessel 22 that is not part of the portion 26, is defined by the portion(s) 24 that is filled with a different cryogen, which in this embodiment is liquid $N_2$. If the portion 24 is defined by different sections, in various embodiments, all of the sections in the portion 24 form a continuous area throughout the vessel 22. As can been seen, in this embodiment, the area defined by the portion 26 is significantly smaller than the area defined by the portion(s) 24. For example, in one embodiment, the He volume in the portion(s) 26 is reduced by a factor of 10 (compared with if the entire vessel 22 is filled with He).

In various embodiments, the vessel 22 includes therein one or more coils that form the magnet 42. For example, a plurality of coils 50 may be supported and maintained on a former 54 (e.g., main magnet former), and a plurality of coils 52 may be supported and maintained on a former 56 (e.g., secondary former). The formers 54 and 56 may be any suitable formers capable of supporting and maintaining coils for a superconducting magnet. In one embodiment, the coils 50 are main magnet coils and the coils 52 are bucking or shield coils. The number and positioning of the coils 50 and 52 may be varied as desired or needed.

The coils 50 and 52 are immersed in liquid He contained with the portion(s) 26, which is a reduced volume as described above. For example, the portions 26 include a larger area defined by portion 26a between the portions 24, smaller gaps defined by the regions 26b and 26c around the former 54, and additional smaller gaps defined by the regions 26d and 26e around the former 56, which extend circumferentially around the formers 54 and 56.

It should be noted that the structure forming the portions 24, namely defining the thermal reservoir includes one or more support walls 58. The support walls 58 define a boundary (e.g., physically separate space within the vessel 22) for the thermal reservoir and may be formed from any suitable metal (e.g., steel) or a composite with a thin metal coating. In this embodiment, the vessel flange 60 is formed from a thinner structure, which is supported (at least in part) by the support walls 58. For example, in one embodiment, the vessel flange 60 is formed from a metal (e.g., steel) having a thickness between about 10 mm and about 20 mm.

The thermal reservoir defined by the portions 24 may optionally include supplemental cooling. In some embodiments, the supplemental cooling includes a plurality of cooling tubes 62 that are in thermal contact with the portion 24, for example, the support walls 58. The cooling tubes 62 may be secured within the portion 24 along the support walls 58 such that the cooling tubes 62 are within the cryogen within the portion 24. The cooling tubes 62 are in fluid communication with the portion 26 via one or more passageways 64. Accordingly, in operation, boiled off He from the portion 26 may circulate within the cooling tubes 62, which is cooled by the cryogen in the portion 24. The cooling tubes 62 may be any shape and size and formed from any suitable material (e.g., copper).

One configuration of the vessel 22 will now be described with particular reference to FIGS. 4 through 10, which also generally illustrates one assembly process for forming the vessel 22. It should be noted that the views shown in FIGS. 4 through 10 include a cutaway portion to show the inside of the structures.

Figure 4:
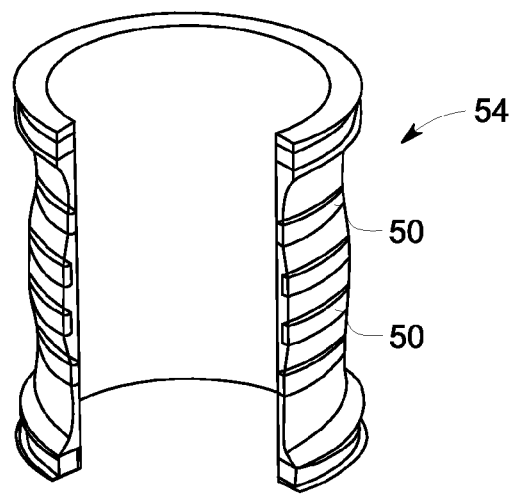
FIGS. 4 and 5 are perspective views of an inner former in accordance with one embodiment.
Figure 5:
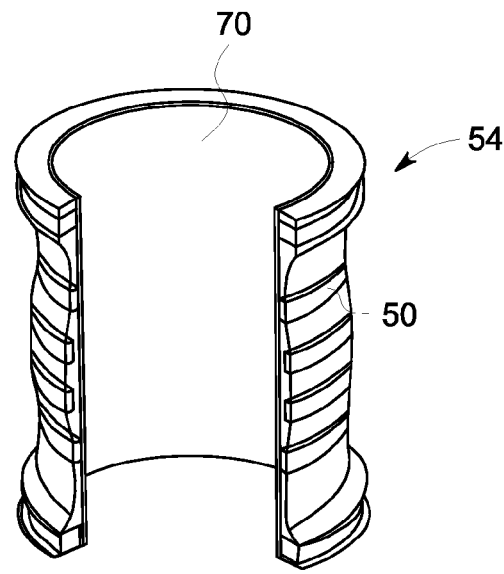
Figure 6:
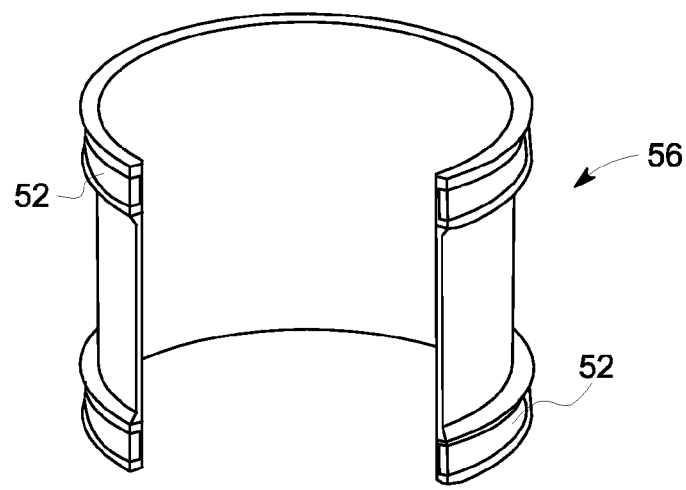
FIG. 6 is a perspective view of an outer former in accordance with one embodiment.
Figure 7:
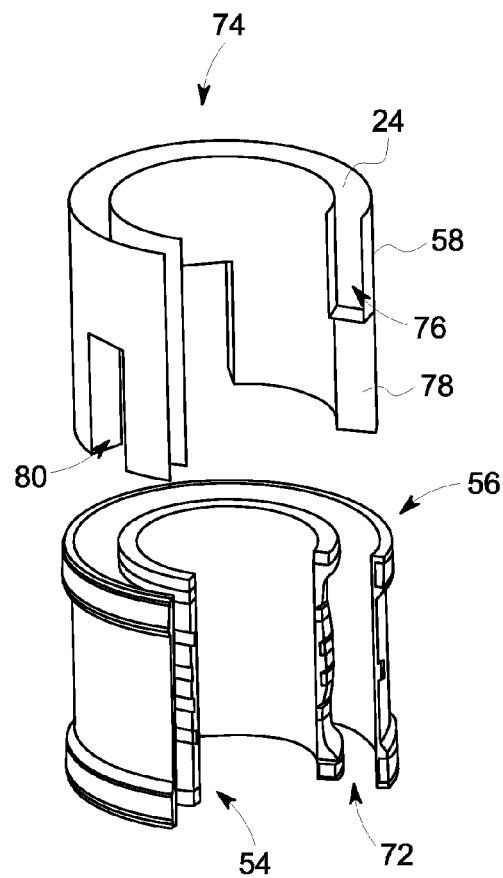
FIG. 7 is an exploded perspective view illustrating formers and a cooling assembly in accordance with one embodiment.

Specifically, FIG. 4 shows the former 54, which is configured as an inner former (main magnet former) having the coils 50 (main magnet coils) supported thereon. As illustrated in FIG. 5, an inner layer 70 may be provided to the former 54, such as a thin metal layer to increase the thermal conductivity of the former 54. In this embodiment, and as shown in FIG. 6, the former 56 is configured as an outer former (bucking former) having the coils 52 (bucking coils) supported thereon. Thus, as shown in FIG. 7, the formers 54 and 56 are cylindrical and concentrically aligned defining a space 72 (e.g., a gap) therebetween. The formers 54 and 56 are provided such that the space 72 defines a region for receiving therein a cooling assembly 74 (e.g., a divided cooling assembly) that includes the portions 24 and 26. As can be seen, the support walls 58 define a thermal reservoir 76 therebetween, which is filled with a cryogen, which in various embodiments is $LN_2$. It should be noted that FIG. 7 illustrates an exploded view.

The cooling assembly 74 includes one or more interconnects 78 between the support walls 58. The interconnects 78 are configured as a bracket structure that support the arrangement, as well as the concentric alignment of the formers 54 and 56. The interconnects 78 may be formed in different shapes and sizes such that a passageway 80, for example, an opening, is defined between the outer and inner sides of the reservoir 76, while maintaining the self-contained area of the reservoir 76. The interconnects 78 form part of the portion 26 (illustrated as 26a in FIG. 3) that defines one of the cryogen regions.

Figure 8:
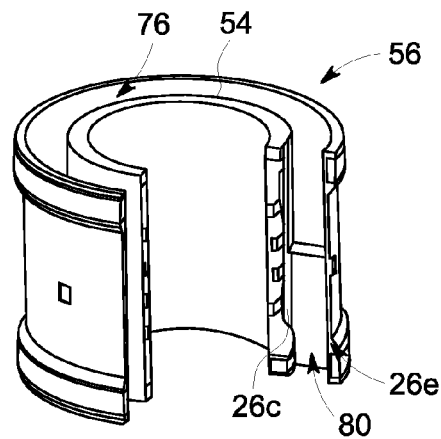
FIGS. 8 and 9 are perspective views of the formers and cooling assembly of FIG. 7 concentrically aligned.

In one assembly process, with the formers 54 and 56 aligned, the cooling assembly 74 is inserted within the space 72 as illustrated in FIG. 8. As can be seen, with the cooling assembly 74 positioned within the space, another area within the portion 26c is defined that provides fluid contact with the coils 50. For example, liquid He covers the coils 50 such that coils 50 are completely covered and immersed in the liquid He. The interconnects 78 also allow liquid He to flow from the portion 26c to the portion 26e.

Figure 9:
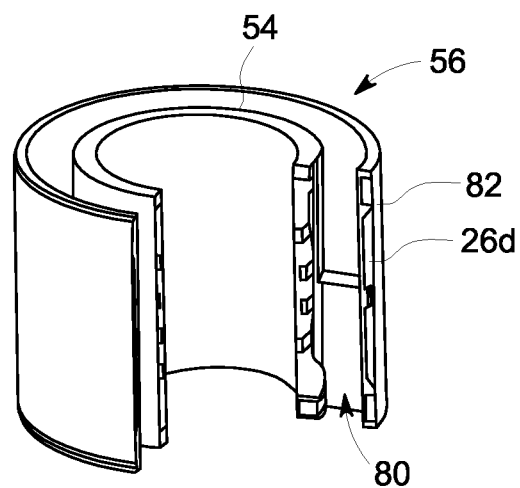
Figure 10:
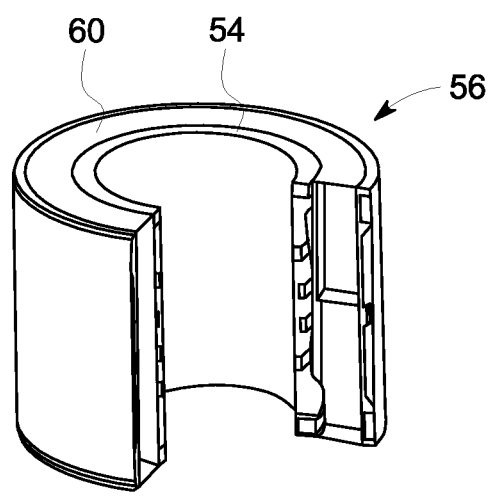
FIG. 10 is a perspective view of the formers and cooling assembly of FIG. 7 concentrically aligned and illustrating a vessel flange.

An outer shell 82 is coupled to the outside circumference of the former 56 as shown in FIG. 9 to define the portion 26d, which also includes liquid He therein. In one embodiment, the assembly process includes coupling the top and bottom of the aligned components, for example, by welding the vessel flange 60 to the top and bottom of the concentrically aligned components to thereby define the portions 24 and 26 forming the multi-cryogen vessel structure.

It should be noted that the configuration and assembly described herein is merely illustrative. Other configurations and assembly methods may be provided. For example, the order of positioning and aligning the various parts may be changed. Additionally, although the various embodiments are described using particular cryogens, different cryogens and quantities of cryogen may be provided.

Thus, a multi-cryogen vessel for an MRI magnet is provided. In various embodiments, a reduced amount of liquid He may be used, such that a reduced He volume can still cool the coils, which may be provided in combination with another cryogen, such as $LN_2$. For example, when shipping the MRI system, such as from the factory to a hospital, the combined cooling of the cryogens maintains the cooled coils. In various embodiments, for example, a ride-through period, when the MRI system is powered off, may be greater than 50 hours. Moreover, in various embodiments, the thermal reservoir, which is the larger volume in the vessel may be filled with a more cost-effective or cheaper cryogen (e.g., $LN_2$) than the cryogen (e.g., liquid He) covering the coils of the MRI magnet.

It should be noted that although some embodiments may be described in connection with superconducting magnets for MRI systems, the various embodiments may be implemented in connection with any type of system having superconducting magnets. The superconducting magnets may be implemented in other types of medical imaging devices, as well as non-medical imaging devices.

Thus, the various embodiments may be implemented in connection with different types of superconducting coils, such as superconducting coils for an MRI system. For example, the various embodiments may be implemented with superconducting coils for use with the MRI system 100 shown in FIG. 11. It should be appreciated that although the system 100 is illustrated as a single modality imaging system, the various embodiments may be implemented in or with multi-modality imaging systems. The system 100 is illustrated as an MRI imaging system and may be combined with different types of medical imaging systems, such as a computed tomography (CT), positron emission tomography (PET), a single photon emission computed tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

Figure 11:
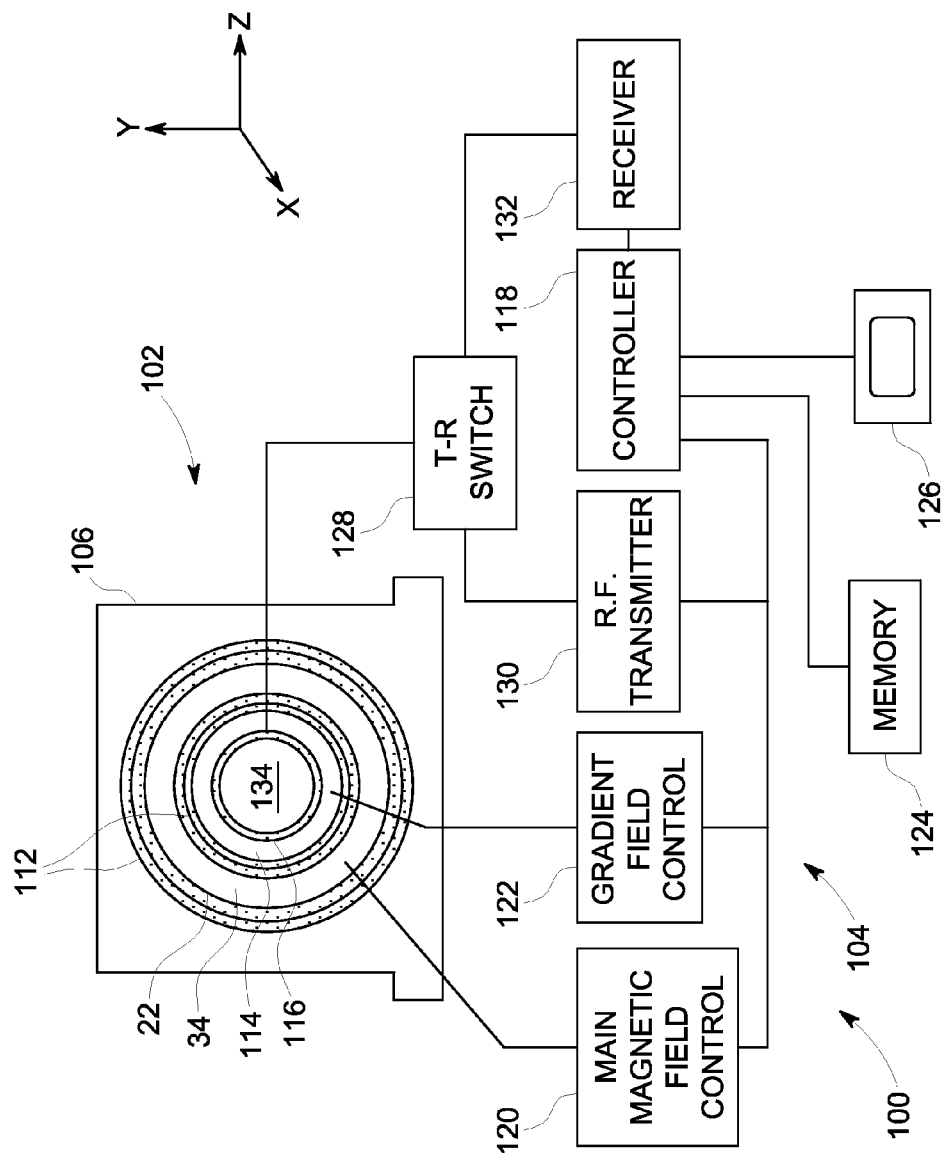
FIG. 11 is a schematic block diagram of an MRI system in which a divided cooling vessel formed in accordance with various embodiments may be implemented.

Referring to FIG. 11, the MRI system 100 generally includes an imaging portion 102 and a processing portion 104 that may include a processor or other computing or controller device. The MRI system 100 includes within a gantry 106 a superconducting magnet 42 formed from coils, which may be supported on a magnet coil support structure. The vessel 22 (which is a multi-cryogen vessel as described herein) surrounds the superconducting magnet 42 and is filled with, for example, liquid He and $LN_2$ as described in more detail herein.

Thermal insulation 112 is provided surrounding the outer surface of the vessel 22 and the inner surface of the superconducting magnet 42. A plurality of magnetic gradient coils 114 are provided inside the superconducting magnet 42 and an RF transmit coil 116 is provided within the plurality of magnetic gradient coils 114. In some embodiments, the RF transmit coil 116 may be replaced with a transmit and receive coil. The components within the gantry 106 generally form the imaging portion 102. It should be noted that although the superconducting magnet 42 is a cylindrical shape, other shapes of magnets can be used.

The processing portion 104 generally includes a controller 118, a main magnetic field control 120, a gradient field control 122, a memory 124, a display device 126, a transmit-receive (T-R) switch 128, an RF transmitter 130 and a receiver 132.

In operation, a body of an object, such as a patient or a phantom to be imaged, is placed in the bore 134 on a suitable support, for example, a patient table. The superconducting magnet 46 produces a uniform and static main magnetic field $B_o$ across the bore 134. The strength of the electromagnetic field in the bore 134 and correspondingly in the patient, is controlled by the controller 118 via the main magnetic field control 120, which also controls a supply of energizing current to the superconducting magnet 42.

The magnetic gradient coils 114, which include one or more gradient coil elements, are provided so that a magnetic gradient can be imposed on the magnetic field $B_o$ in the bore 134 within the superconducting magnet 42 in any one or more of three orthogonal directions x, y, and z. The magnetic gradient coils 114 are energized by the gradient field control 122 and are also controlled by the controller 118.

The RF transmit coil 116, which may include a plurality of coils, is arranged to transmit magnetic pulses and/or optionally simultaneously detect MR signals from the patient if receive coil elements are also provided, such as a surface coil configured as an RF receive coil. The RF receive coil may be of any type or configuration, for example, a separate receive surface coil. The receive surface coil may be an array of RF coils provided within the RF transmit coil 116.

The RF transmit coil 116 and the receive surface coil are selectably interconnected to one of the RF transmitter 130 or receiver 132, respectively, by the T-R switch 128. The RF transmitter 130 and T-R switch 128 are controlled by the controller 118 such that RF field pulses or signals are generated by the RF transmitter 130 and selectively applied to the patient for excitation of magnetic resonance in the patient. While the RF excitation pulses are being applied to the patient, the T-R switch 128 is also actuated to disconnect the receive surface coil from the receiver 132.

Following application of the RF pulses, the T-R switch 128 is again actuated to disconnect the RF transmit coil 116 from the RF transmitter 130 and to connect the receive surface coil to the receiver 132. The receive surface coil operates to detect or sense the MR signals resulting from the excited nuclei in the patient and communicates the MR signals to the receiver 132. These detected MR signals are in turn communicated to the controller 118. The controller 118 includes a processor (e.g., image reconstruction processor), for example, that controls the processing of the MR signals to produce signals representative of an image of the patient.

The processed signals representative of the image are also transmitted to the display device 126 to provide a visual display of the image. Specifically, the MR signals fill or form a k-space that is Fourier transformed to obtain a viewable image. The processed signals representative of the image are then transmitted to the display device 126.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or the examples include equivalent structural elements with insubstantial differences from the literal languages of the claims.

What is claimed is:

1. A cooling vessel for a magnetic resonance imaging (MRI) magnet system, the cooling vessel comprising:
    a first portion containing a helium cryogen in contact with a plurality of magnet coils of an MRI system;
    a second portion separate from and fluidly decoupled from the first portion, the second portion containing a material different than the helium cryogen and having a volume greater than the first portion; and
    a plurality of cooling tubes in fluid connection with the first portion and in thermal contact with the second portion such that boiled off helium cryogen from the first portion circulates within the plurality of cooling tubes and is cooled by the material within the second portion.

2. The cooling vessel of claim 1, wherein the second portion defines a thermal reservoir containing liquid nitrogen.

3. The cooling vessel of claim 1, wherein the cryogen in the second portion has a higher heat capacity than the helium cryogen in the first portion.

4. The cooling vessel of claim 1, wherein the plurality of cooling tubes are within the second portion.

5. The cooling vessel of claim 4, wherein the plurality of cooling tubes are coupled to a support wall within the second portion.

6. The cooling vessel of claim 1, further comprising a cylindrical inner former and a cylindrical outer former concentrically aligned with each other, the formers supporting the plurality of magnet coils, and wherein the first and second portions are configured as a cooling assembly inserted between the formers.

7. The cooling vessel of claim 6, wherein the cooling assembly comprises one or more interconnects providing fluid communication between the magnet coils of the inner and outer formers.

8. The cooling vessel of claim 7, wherein the one or more interconnects comprise a bracket structure configured to support the position of the inner and outer formers.

9. The cooling vessel of claim 1, wherein the material in the second portion is a cryogen in solid form at a superconducting temperature.

10. A magnetic resonance imaging (MRI) magnet system comprising:

a main magnet former supporting main magnet coils;
a secondary former supporting bucking coils; and
a divided cooling vessel having physically separate portions each containing a different cryogen, and wherein the main magnet coils and the bucking coils are immersed and in direct contact with the cryogen in one of the separate portions.

11. The MRI magnet system of claim 10, wherein the divided vessel comprises one or more interconnects formed as bracket structures for maintaining the positioning of the main magnet former and the secondary former.

12. The MRI magnet system of claim 11, wherein the one or more interconnects further define a fluid passageway within one of the portions and between the main magnet coils and the bucking coils.

13. The MRI magnet system of claim 10, wherein the cryogens comprise helium and nitrogen.

14. The MRI magnet system of claim 13, wherein the portion containing the nitrogen is larger than the portion containing the helium, and the portion containing the helium has a volume of helium of about 200 liters.

15. The MRI magnet system of claim 13, further comprising a plurality of cooling tubes in fluid connection with the portion containing helium and in thermal contact with the portion containing nitrogen.

16. The MRI magnet system of claim 13, wherein the portion containing nitrogen is a thermal reservoir and the nitrogen is in a solid state during operation of the MRI system.

17. The MRI magnet system of claim 10, wherein the main magnet former is an inner cylindrical former and the secondary former is an outer cylindrical former concentrically aligned with the inner cylindrical former, with the divided cooling vessel therebetween defining a cylindrical structure.

18. A method for forming a cooling vessel for a magnetic resonance imaging (MRI) system, the method comprising:
aligning a main magnet former and a secondary former in a concentric arrangement, wherein the formers each have magnet coils;
inserting a divided cooling assembly concentrically between the main magnet former and the secondary former, the divided cooling assembly having two separate portions for receiving therein a helium cryogen and another different cryogen, the portion for receiving the helium cryogen being smaller than the portion for receiving the different cryogen and having the magnet coils immersed and in direct contact with the helium cryogen therein; and
coupling vessel flanges to each end of the concentrically aligned formers and divided cooling assembly.

19. The method of claim 18, further comprising coupling an outer shell to an outside circumference of the secondary former with the secondary former being radially outward from the main magnet former.

20. The cooling vessel of claim 1, wherein the material in the second portion is liquid nitrogen and the second portion is sized to have a volume of liquid nitrogen to cool, for about 50 hours, the plurality of magnet coils of the MRI system when the MRI system is powered off.

* * * * *